United States Patent
Terajima et al.

(10) Patent No.: US 11,480,752 B2
(45) Date of Patent: Oct. 25, 2022

(54) PIEZOELECTRIC DRIVING DEVICE, OPTICAL MEMBER DRIVING DEVICE, CAMERA DEVICE, AND ELECTRONIC APPARATUS

(71) Applicant: New Shicoh Motor Co., Ltd., Zhejiang (CN)

(72) Inventors: Kokichi Terajima, Kanagawa (JP); Masahiro Akatsu, Kanagawa (JP); Kei Onodera, Kanagawa (JP)

(73) Assignee: NEW SHICOH MOTOR CO., LTD., Zhejiang (CN)

( * ) Notice: Subject to any disclaimer, the term of this patent is extended or adjusted under 35 U.S.C. 154(b) by 486 days.

(21) Appl. No.: 16/695,403

(22) Filed: Nov. 26, 2019

(65) Prior Publication Data

US 2020/0200989 A1   Jun. 25, 2020

(30) Foreign Application Priority Data

Dec. 20, 2018 (CN) .......................... 201811564266.3

(51) Int. Cl.
  *G02B 7/02*   (2021.01)
  *G02B 7/18*   (2021.01)
  *H02N 2/06*   (2006.01)
  *H02N 2/02*   (2006.01)

(52) U.S. Cl.
  CPC ............. *G02B 7/02* (2013.01); *G02B 7/1805* (2013.01); *H02N 2/028* (2013.01); *H02N 2/065* (2013.01)

(58) Field of Classification Search
  CPC ........ H02N 2/028; H02N 2/065; H02N 2/026; H02N 2/06; H01L 41/047; H01L 41/0973; G02B 7/02; G02B 7/1805; G02B 7/005; G02B 7/00
  See application file for complete search history.

(56) References Cited

U.S. PATENT DOCUMENTS

| | | | |
|---|---|---|---|
| 2004/0189150 A1 | 9/2004 | Yamamoto et al. | |
| 2012/0217844 A1* | 8/2012 | Tani | G02B 26/0858 310/328 |

FOREIGN PATENT DOCUMENTS

JP   2004-320846   11/2004

* cited by examiner

*Primary Examiner* — Emily P Pham
(74) *Attorney, Agent, or Firm* — Fildes & Outland, P.C.

(57) ABSTRACT

A piezoelectric driving device includes: a driving portion to be brought into frictional contact with an object to be driven, which is moved with respect to a fixed body; and at least two piezoelectric portions, which are formed integrally with the driving portion, are arranged on a predetermined plane with the driving portion being sandwiched between the at least two piezoelectric portions, and are configured to be bent with respect to the predetermined plane when voltages are applied to the at least two piezoelectric portions, wherein outer edges of entirety of the at least two piezoelectric portions are fixed to the fixed body.

11 Claims, 10 Drawing Sheets

PIEZOELECTRIC DRIVING DEVICE, OPTICAL MEMBER DRIVING DEVICE, CAMERA DEVICE, AND ELECTRONIC APPARATUS

BACKGROUND OF THE INVENTION

1. Field of the Invention

The present invention relates to a piezoelectric driving device, an optical member driving device, a camera device, and an electronic apparatus.

2. Description of the Related Art

As a related-art piezoelectric driving device, for example, as described in Japanese Patent Application Laid-open No. 2004-320846, there has been known a piezoelectric driving device, which includes a plurality of divided piezoelectric elements arranged in a planar manner, and is configured to drive an object to be driven by applying a voltage to each of the piezoelectric elements.

However, the above-mentioned related-art piezoelectric driving device is configured to drive the object to be driven in one axial direction by combining an oscillation mode in an X-axis direction and an oscillation mode in a Y-axis direction, which is orthogonal to the X-axis direction. Therefore, there has been a problem in that driving is possible only in one direction with the two oscillation modes in the X- and Y-axis directions.

SUMMARY OF THE INVENTION

The present invention has been made to solve the above-mentioned problem in the related art, and has an object to provide a piezoelectric driving device, an optical member driving device, a camera device, and an electronic apparatus, which are capable of driving an object to be driven in one direction by oscillation in the one direction, and of driving the object to be driven in two directions by combining the driving in one direction.

According to at least one embodiment of the present invention, a piezoelectric driving device is provided. The piezoelectric driving device includes: a driving portion to be brought into frictional contact with an object to be driven, which is moved with respect to a fixed body; and at least two piezoelectric portions, which are formed integrally with the driving portion, are arranged on a predetermined plane with the driving portion being sandwiched between the at least two piezoelectric portions, and are configured to be bent with respect to the predetermined plane when voltages are applied to the at least two piezoelectric portions, wherein outer edges of entirety of the at least two piezoelectric portions are fixed to the fixed body.

It is preferred that the at least two piezoelectric portions include four piezoelectric portions, which are arranged in a circulated manner around the driving portion on the predetermined plane.

It is also preferred that the at least two piezoelectric portions include a plate-like piezoelectric element, a plate-like elastic body fixed to one surface of the plate-like piezoelectric element, and an electrode fixed to another surface of the plate-like piezoelectric element on an opposite side to the one surface. It is further preferred that the plate-like elastic body be divided into at least two elastic bodies, or the electrode be divided into at least two electrodes, so as to correspond to the plate-like piezoelectric element. It is also preferred that the driving portion be formed integrally with the plate-like elastic body.

The at least two piezoelectric portions may further include a plate-like second piezoelectric element and a second electrode, one surface of the plate-like second piezoelectric element may be configured to fix another surface of the plate-like elastic body on an opposite side to a surface of the plate-like elastic body that is fixed to the plate-like piezoelectric element, and the second electrode may be fixed to another surface of the plate-like second piezoelectric element on an opposite side to the one surface of the plate-like second piezoelectric element.

It is also preferred that the piezoelectric driving device further include a control unit configured to control the voltages to be applied to the at least two piezoelectric portions, the control unit being configured to apply, to the at least two piezoelectric portions, a first signal for moving the driving portion along a normal direction of the predetermined plane, and a second signal for moving the driving portion along a direction in which the plate-like piezoelectric element is arranged.

According to another embodiment of the present invention, an optical member driving device is provided. In the optical member driving device, the object to be driven is one of an optical member and a member used to attach the optical member. Further, according to still another embodiment of the present invention, a camera device is provided. The camera device includes the above-mentioned optical member driving device. Further, according to still another embodiment of the present invention, an electronic apparatus is provided. The electronic apparatus includes the above-mentioned camera device.

According to the embodiments of the present invention, the piezoelectric driving device includes: the driving portion to be brought into frictional contact with the object to be driven, which is moved with respect to the fixed body; and the at least two piezoelectric portions, which are formed integrally with the driving portion, are arranged on the predetermined plane with the driving portion being sandwiched between the at least two piezoelectric portions, and are configured to be bent with respect to the predetermined plane when the voltages are applied to the at least two piezoelectric portions. Further, the outer edges of the entirety of the at least two piezoelectric portions are fixed to the fixed body. Therefore, when the at least two piezoelectric portions include two piezoelectric portions, the two piezoelectric portions can be oscillated in one direction to drive the object to be driven in the one direction. Further, when the at least two piezoelectric portions include four piezoelectric portions, the four piezoelectric portions can be driven in two directions to drive the object to be driven in the two directions.

BRIEF DESCRIPTION OF THE DRAWINGS

FIG. 7A, FIG. 7B, and FIG. 7C are explanatory diagrams for illustrating control of the driving mechanism used in the driving device according to the embodiments of the present invention, in which FIG. 7A is a timing chart, FIG. 7B is a sectional view for illustrating movement of a tip P of a driving portion of the driving mechanism, and FIG. 7C is a chart for illustrating a locus of the tip P of the driving portion of the driving mechanism.

FIG. 8A and FIG. 8B are explanatory diagrams for illustrating movement in a first modification example of the control of the driving mechanism used in the driving device according to the embodiments of the present invention, in which FIG. 8A is a timing chart, and FIG. 8B is a chart for illustrating a locus of the tip P of the driving portion of the driving mechanism.

FIG. 9A and FIG. 9B are explanatory diagrams for illustrating movement in a second modification example of the driving mechanism used in the driving device according to the embodiments of the present invention, in which FIG. 9A is a timing chart, and FIG. 9B is a chart for illustrating a locus of the tip P of the driving portion of the driving mechanism.

DESCRIPTION OF THE EMBODIMENTS

Embodiments of the present invention are now described referring to the accompanying drawings.

Figure 1:
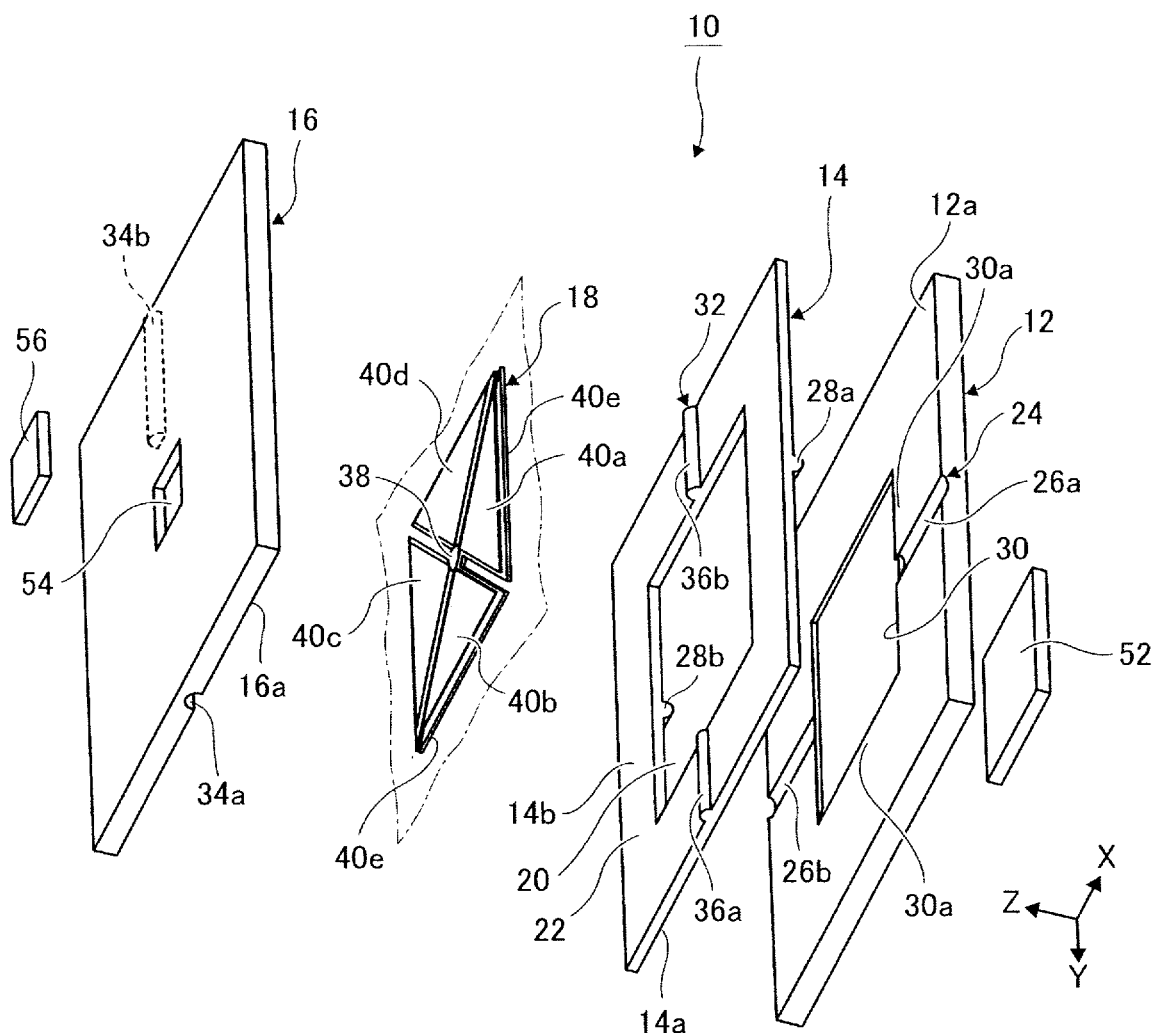
FIG. 1 is an exploded perspective view for illustrating a driving device according to embodiments of the present invention.
Figure 2:
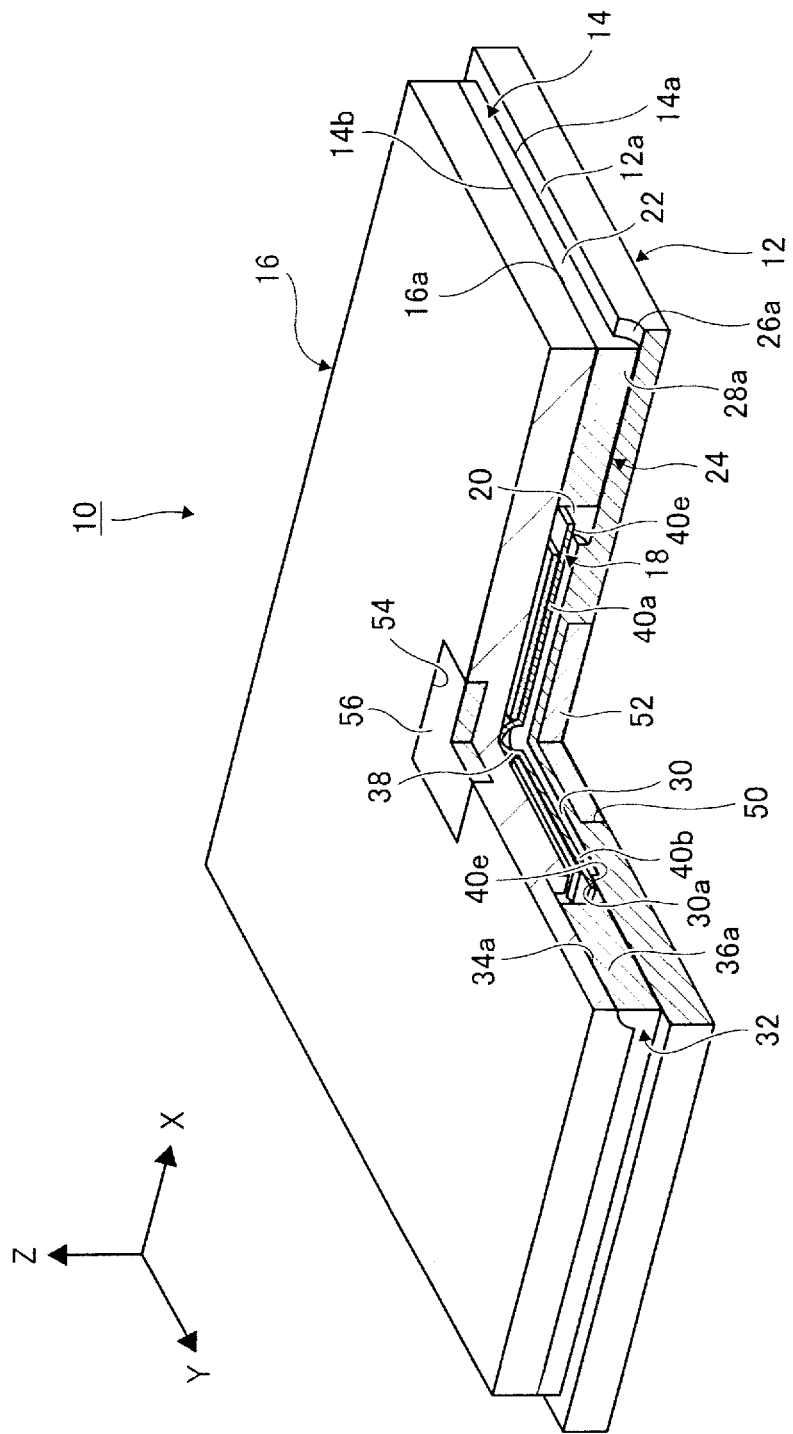
FIG. 2 is a sectional perspective view for illustrating a driving device according to a first embodiment of the present invention.

In FIG. 1 and FIG. 2, a driving device 10 according to a first embodiment of the present invention is illustrated. The driving device 10 includes a fixed body 12, an intermediate member 14, an object to be driven 16, and a driving mechanism 18.

The fixed body 12 is formed into a square plate shape, and has a first surface 12a extending in one plane.

In this specification, in an XYZ coordinate system, the plane in which the first surface 12a of the fixed body 12 extends is defined as XY directions (an X axis and a Y axis are orthogonal to each other), and an axis orthogonal to the XY directions is defined as a Z axis.

The intermediate body 14 is formed into a square plate shape having a size that is slightly smaller than that of the fixed body 12. The intermediate body 14 is opposed to the first surface 12a of the fixed body 12, and has a second surface 14a extending in the XY directions, and a third surface 14b extending in the XY directions on the opposite side to the second surface 14a. Further, the intermediate body 14 has a square-shaped through hole 20 formed on an inner side thereof, and the periphery of the through hole 20 forms a frame portion 22.

The object to be driven 16 is, for example, a lens, a light receiving sensor, a prism, or other optical members, or a member used to attach the optical members, and is formed into a square plate shape having substantially the same size as that of the intermediate member 14. The object to be driven 16 is opposed to the third surface 14b of the intermediate member 14, and has a fourth surface 16a extending in the XY directions.

A first guiding mechanism 24 is provided between the first surface 12a of the fixed body 12 and the second surface 14a of the intermediate member 14. The first guiding mechanism 24 includes first concave portions 26a and 26b formed in the first surface 12a of the fixed body 12, and first convex portions 28a and 28b formed on the second surface 14a of the intermediate body 14 to be fitted into the first concave portions 26a and 26b. The first concave portions 26a and 26b are formed at the center in a Y direction of the fixed body 12 and extend in an X direction from an outer end of the fixed body 12 to a clearance groove portion 30, which is to be described later. Further, the first convex portions 28a and 28b are formed at the center in the Y direction of the intermediate body 14 and extend in the X direction from an outer end of the frame portion 22 to the through hole 20. In order to ensure movement of the intermediate body 14, the first convex portions 28a and 28b are formed to be slightly shorter than the first concave portions 26a and 26b. The first guiding mechanism 24 is configured to guide the intermediate body 14 in the X direction with respect to the fixed body 12, and prohibit movement in the Y direction.

In the first embodiment, the first concave portions 26a and 26b are formed in the fixed body 12, and the first convex portions 28a and 28b are formed on the intermediate body 14. However, to the contrary, the first concave portions 26a and 26b may be formed in the intermediate body 14, and the first convex portions 28a and 28b may be formed on the fixed body 12.

A second guiding mechanism 32 is provided between the third surface 14b of the intermediate body 14 and the fourth surface 16a of the object to be driven 16. The second guiding mechanism 32 includes, similarly to the first guiding mechanism 24, second concave portions 34a and 34b formed in the fourth surface 16a of the object to be driven 16, and second convex portions 36a and 36b formed on the third surface 14b of the intermediate member 14 to be fitted into the second concave portions 34a and 34b. The second concave portions 34a and 34b are formed at the center in the X direction and extend in the Y direction for about a half the distance from an outer end of the object to be driven 16 to the center of the object to be driven 16. Further, the second convex portions 36a and 36b are formed from the outer end of the frame portion 22 to the through hole 20 to extend in the Y direction in the X direction center. In order to ensure movement of the object to be driven 16, the second convex portions 36a and 36b are formed to be slightly shorter than the second concave portions 34a and 34b. The second guiding mechanism 32 is configured to guide the object to be driven 16 in the Y direction with respect to the intermediate member 14, and prohibit movement in the X direction.

In the first embodiment, the second concave portions 34a and 34b are formed in the object to be driven 16, and the second convex portions 36a and 36b are formed on the intermediate member 14. However, to the contrary, the second concave portions 34a and 34b may be formed in the intermediate member 14, and the second convex portions 36a and 36b may be formed on the object to be driven 16.

The first concave portions 26a and 26b and the first convex portions 28a and 28b, and the second concave portions 34a and 34b and the second convex portions 36a and 36b are formed into a semi-circular shape in section, but may be formed into a U shape or a V shape in section, for example. Further, portions of the first concave portions 26a and 26b and the first convex portions 28a and 28b, and the second concave portions 34a and 34b and the second convex portions 36a and 36b that are brought into contact with each other may be coated with a material for reducing friction.

Figure 3:
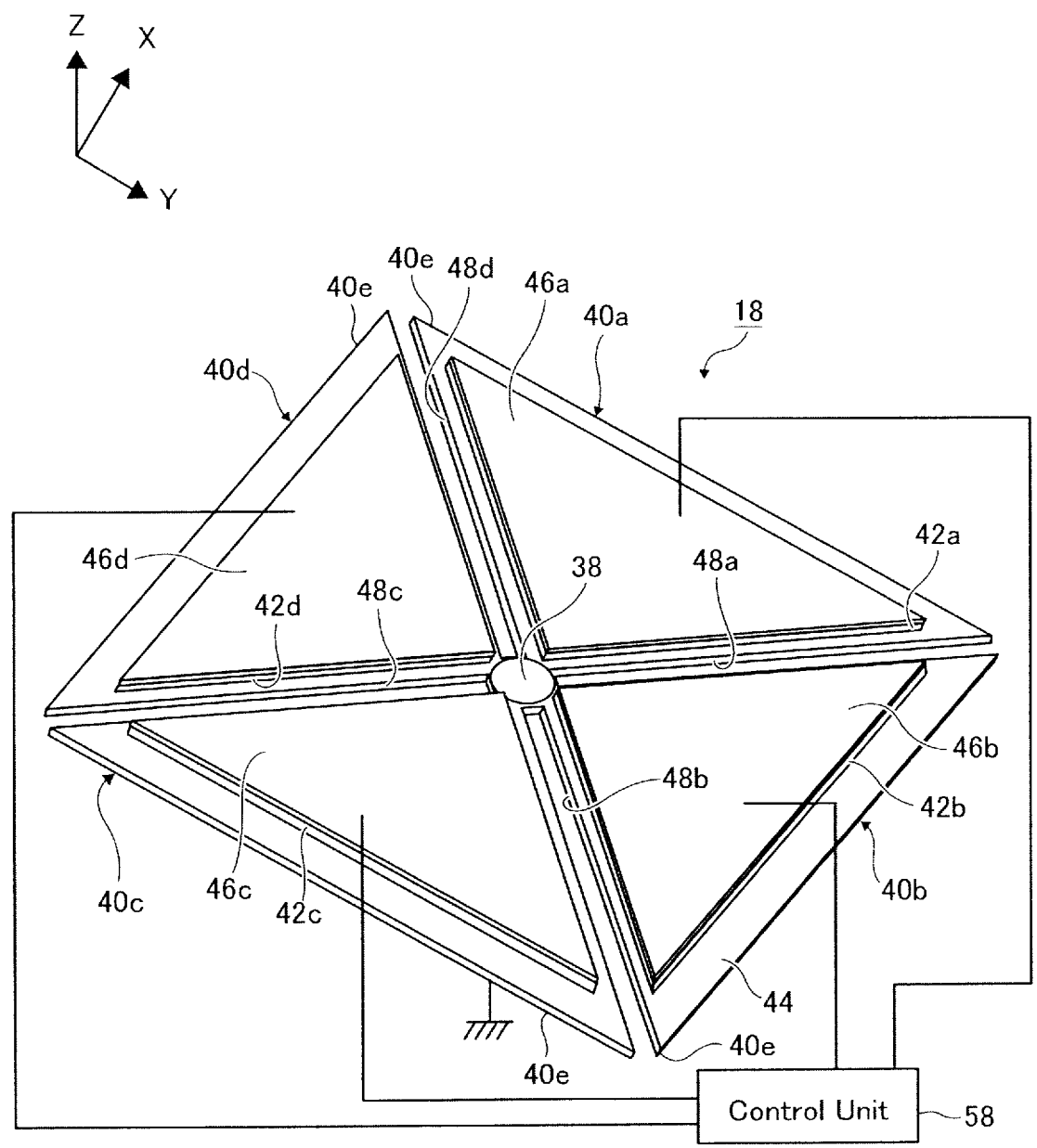
FIG. 3 is a perspective view for illustrating a driving mechanism used in the driving device according to the embodiments of the present invention.
Figure 4:
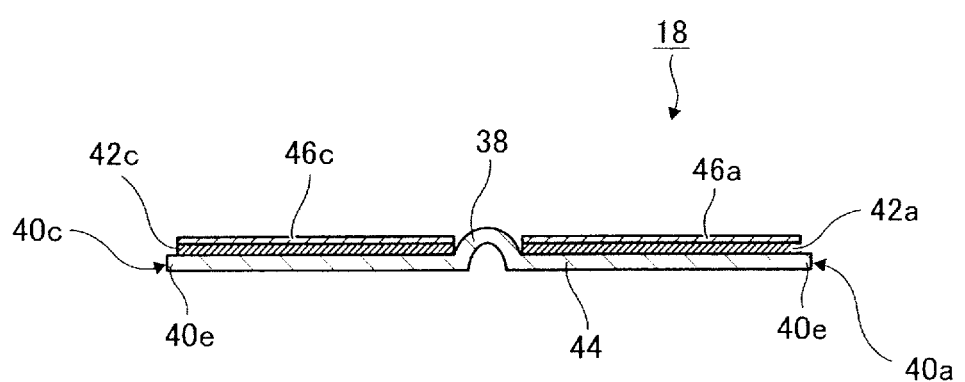
FIG. 4 is a sectional view taken along an X direction for illustrating the driving mechanism used in the driving device according to the embodiments of the present invention.

As illustrated in FIG. 3 and FIG. 4, the driving mechanism 18 includes a driving portion 38 arranged at the center, and piezoelectric portions 40a, 40b, 40c, and 40d, which are divided four for example, and extend in the XY directions around the driving portion 38, and are arranged in a circulated manner to be separated by 90° around the driving portion 38.

The piezoelectric portions 40a to 40d are formed into a square plate shape as a whole. The piezoelectric portions 40a to 40d have piezoelectric elements 42a to 42d, each of which is formed into a triangular plate shape. On one surface (back surface) of the piezoelectric elements 42a to 42d, a plate-like elastic body 44 made of a metal is fixed. Further, on another surface (front surface) on the opposite side to the one surface of the piezoelectric elements 42a to 42d, four divided electrodes 46a to 46d are provided. The elastic body 44 is formed integrally with the driving portion 38, and is divided into four portions by kerfs 48a to 48d formed from the driving portion 38 to corner portions of the piezoelectric portions 40a to 40d.

The driving portion 38 is protruded in a semi-spherical manner toward the object to be driven 16 described above. A tip of the driving portion 38 abuts against the center of the fourth surface 16a of the object to be driven 16. It should be noted, however, that the driving portion 38 does not always abut against the fourth surface 16a of the object to be driven 16, but abuts against the fourth surface 16a of the object to be driven 16 only when, from a stationary state in which no voltage is applied, voltages for bending the elastic body 44 to the side of the object to be driven 16 are applied to the piezoelectric portions 40a to 40d.

In the first surface 12a of the fixed body 12, the clearance groove portion 30 is formed into a square shape that is slightly smaller than outer edges 40e of the entirety of the piezoelectric portions 40a to 40d. As illustrated in FIG. 2, the outer edges 40e of the entirety of the piezoelectric portions 40a to 40d are fixed to the fixed body 12 at an outer periphery 30a of the clearance groove portion 30. Further, the piezoelectric portions 40a to 40d are arranged in a space formed by the clearance groove portion 30 of the fixed body 12 and the through hole 20 of the intermediate member 14. Further, the clearance groove portion 30 and the through hole 20 allow the piezoelectric portions 40a to 40d to be bent when the voltages for bending the piezoelectric portions 40a to 40d are applied. Therefore, when the voltages are applied to the piezoelectric portions 40a to 40d, the piezoelectric portions 40a to 40d extend so that the piezoelectric portions 40a to 40d are bent around the driving portion 38.

In a surface (back surface) on the opposite side to the first surface 12a of the fixed body 12, a magnetic body insertion groove 50 is formed. In the magnetic body insertion groove 50, a magnetic body 52 is inserted, and the magnetic body 52 is fixed to the fixed body 12. Meanwhile, in a surface (front surface) on the opposite side to the fourth surface 16a of the object to be driven 16, a magnet insertion groove 54 is formed. In the magnet insertion groove 54, a magnet 56 is inserted, and the magnet 56 is fixed to the object to be driven 16. The magnet 56 and the magnetic body 52 are opposed to each other with the fixed body 12, the object to be driven 16, and the driving mechanism 18 being sandwiched therebetween, and an attractive force for attracting the object to be driven 16 to the fixed body 12 side acts therebetween.

In the first embodiment, the object to be driven 16 is attracted to the fixed body 12 side by the magnetic body 52 and the magnet 56. However, as another embodiment, a magnet having a different magnetic pole on a surface opposed to the magnet 56 may be provided instead of the magnetic body 52 to attract the object to be driven 16 to the fixed body 12 side.

As illustrated in FIG. 3, the elastic body 44 made of metal serves as a common electrode to be grounded. Further, each of the electrodes 46a to 46d is connected as an individual electrode to a control unit 58.

The elastic body 44 may be made of a non-conductive material, and electrodes may be provided on a surface on the opposite side to the surface of the piezoelectric elements 42a to 42d that has the electrodes 46a to 46d provided thereon so that the electrodes on the opposite side serve as the common electrode.

In the first embodiment described above, the piezoelectric portions 40a to 40d are of a unimorph type, in which the piezoelectric elements 42a to 42d and the electrodes 46a to 46d are provided on one surface of the elastic body 44. However, as illustrated in FIG. 5, the piezoelectric portions 40a to 40d may be of a bimorph type, in which piezoelectric elements and electrodes are provided on both sides of the elastic body 44.

Figure 5:
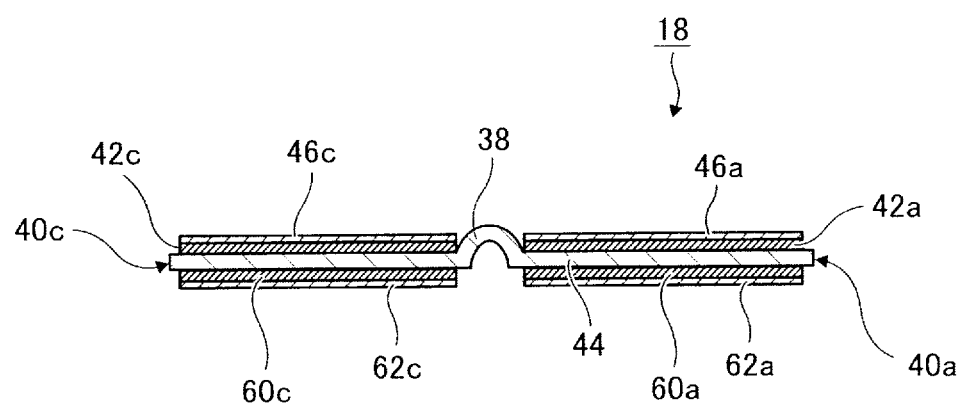
FIG. 5 is a sectional view taken along the X direction for illustrating a modification example of the driving mechanism used in the driving device according to the embodiments of the present invention.

In other words, the piezoelectric portions 40a to 40d include plate-like second piezoelectric elements 60a to 60d (60a and 60c are illustrated in FIG. 5) and second electrodes 62a to 62d (62a and 62c are illustrated in FIG. 5). One surface of the second piezoelectric elements 60a to 60d fixes the other surface (back surface) on the opposite side to the surface of the elastic body 44 that is fixed to the piezoelectric elements 42a to 42d described above, and further, the second electrodes 62a to 62d are connected to the other surface (front surface) on the side opposite to the one surface of the second piezoelectric elements 60a to 60d.

Next, the control unit 58 configured to control the voltages to be applied to the piezoelectric portions 40a to 40d is described in detail.

Figure 6:
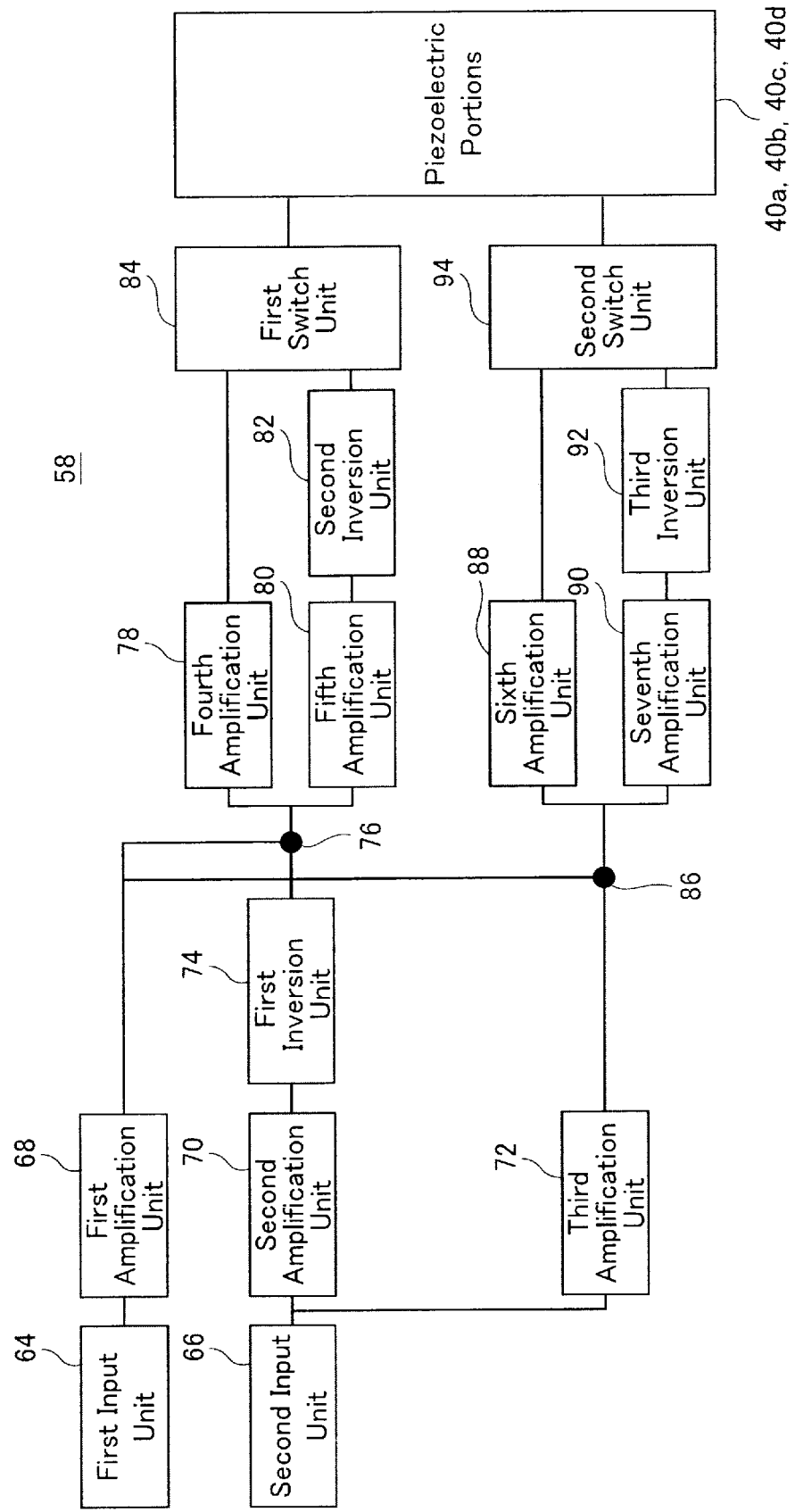
FIG. 6 is a block diagram of a control unit used for the driving device according to the embodiments of the present invention.

FIG. 6 is a block diagram for illustrating the control unit 58.

The control unit 58 includes a first input unit 64 and a second input unit 66. To the first input unit 64, a first signal having a waveform of a predetermined shape is input. To the second input unit 66, a second signal having a waveform of a predetermined shape and the same frequency as the first signal input to the first input unit 64 is input. Examples of the waveform of each of the first signal and the second signal include square, sinusoidal, and trapezoidal. Further, the waveforms of the first signal and the second signal may be the same or different.

As described later, the first signal is applied so as to move the driving portion 38 described above along a Z direction. Further, also as described later, the second signal is applied so as to move the driving portion 38 in the direction in which the piezoelectric portions 40a to 40d are arranged, that is, to move the tip of the driving portion 38 along the XY directions.

The first signal input to the first input unit 64 is amplified by a first amplification unit 68. Further, the second signal input to the second input unit 66 is amplified by a second amplification unit 70 or a third amplification unit 72. The second signal amplified by the second amplification unit 70 is inverted by a first inversion unit 74.

The first signal amplified by the first amplification unit 68 and the second signal inverted by the first inversion unit 74 are combined by a first combining unit 76. A signal obtained as a result of the combination in the first combining unit 76 is amplified by a fourth amplification unit 78, or is amplified by a fifth amplification unit 80 and inverted by a second inversion unit 82. The signal amplified by the fourth amplification unit 78 or the signal inverted by the second inversion unit 82 is selected by a first switch unit 84, and is selectively applied to the piezoelectric portions 40*a*, 40*b*, 40*c*, and 40*d*.

Further, the first signal amplified by the first amplification unit 68 and the second signal amplified by the third amplification unit 72 are combined by a second combining unit 86. A signal obtained as a result of the combination in the second combining unit 86 is amplified by a sixth amplification unit 88, or is amplified by a seventh amplification unit 90 and inverted by a third inversion unit 92. The signal amplified by the sixth amplification unit 88 or the signal inverted by the third inversion unit is selected by a second switch unit 94, and is selectively applied to the piezoelectric portions 40*a*, 40*b*, 40*c*, and 40*d*, for example.

Next, the control by the control unit 58 is described in combination with the movement of the driving mechanism 18.

Figure 7A:
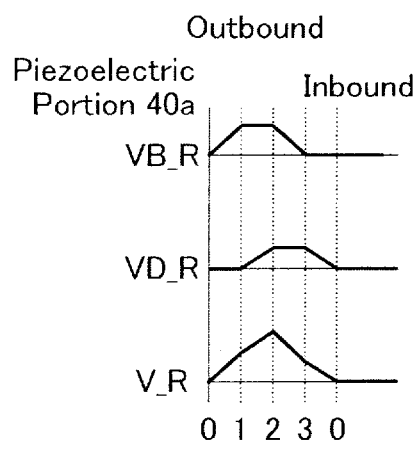
Figure 7A:
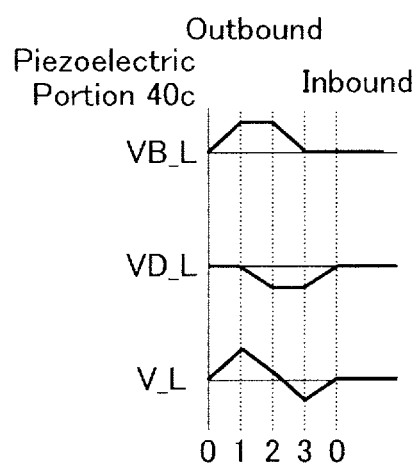
Figure 7B:
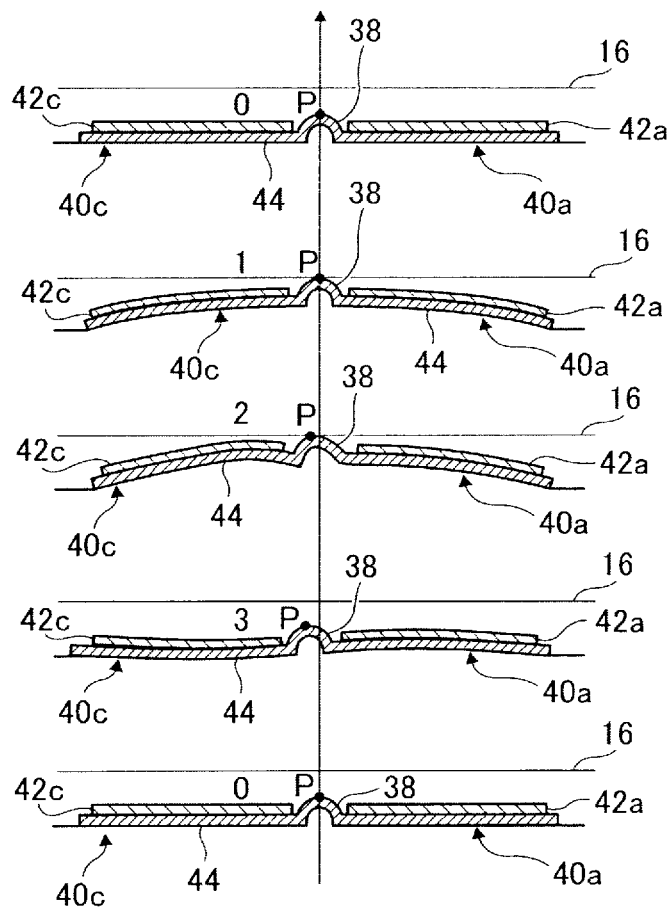
Figure 7C:
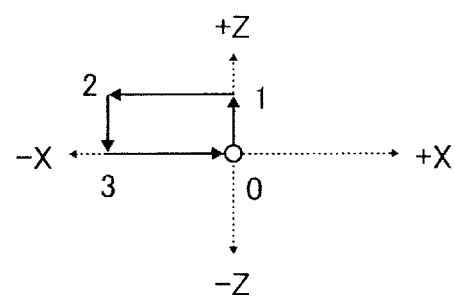

In FIG. 7A to FIG. 7C, an example of the control by the control unit 58 and the movement of the driving mechanism 18 is illustrated. In this example, the object to be driven 16 is controlled with the use of the piezoelectric portions 40*a* and 40*c* in the X direction.

In FIG. 7A, VB_R represents a voltage of the first signal applied to the piezoelectric portion 40*a*, VD_R represents a voltage of the second signal applied to the piezoelectric portion 40*a*, and V_R represents a voltage of the combined signal applied to the piezoelectric portion 40*a*. Further, VB_L represents a voltage of the first signal applied to the piezoelectric portion 40*c*, VD_L represents a voltage of the second signal applied to the piezoelectric portion 40*c*, and V_L represents a voltage of the combined signal applied to the piezoelectric portion 40*c*. Further, in FIG. 7B, P denotes the tip of the driving portion 38. Further, a description is given assuming that signals of a trapezoidal waveform are input.

First, at time 0, the driving mechanism 18 is in the stationary state before the signals are applied, and the tip P is at an origin position 0. Next, the first signal starts being applied to the piezoelectric portions 40*a* and 40*c*, and VB_R and VB_L are both increased. When the application of the first signal to the piezoelectric portions 40*a* and 40*c*, the piezoelectric elements 42*a* and 42*c* start expanding. Both sides of the piezoelectric portions 40*a* and 40*c* are fixed to the fixed body 12, and hence the piezoelectric elements 42*a* and 42*c* are deformed to be bent upward together with the elastic body 44. When the elastic body 44 is bent upward, the tip P of the driving portion 38 moves from the origin position 0 to a +Z direction, and is located at a position 1 in the +Z direction at time 1. When the tip P of the driving portion 38 moves to the +Z direction, the tip P of the driving portion 38 abuts against the object to be driven 16 to be brought into frictional contact with the object to be driven 16.

Next, the second signal is applied under a state in which VB_R and VB_L are maintained. As the second signal, a gradually increasing voltage VD_R is applied to the piezoelectric portion 40*a*, and a gradually reducing voltage VD_L is applied to the piezoelectric portion 40*c*. Therefore, the piezoelectric element 42*a* further expands, and the piezoelectric element 42*c* contracts. Consequently, the tip P of the driving portion 38 moves to a position 2 in a −X direction while maintaining the position in the +Z direction, that is, while maintaining the frictional contact with the object to be driven 16. The tip P of the driving portion 38 moves while being in frictional contact with the object to be driven 16, and hence the object to be driven 16 also moves in the −X direction.

Next, the voltages VB_R and VB_L, which are applied as the first signal, are reduced to 0 while maintaining VD_R and VD_L. At time 3, the voltage V_R applied to the piezoelectric portion 40*a* becomes positive, and the voltage V_L applied to the piezoelectric portion 40*c* becomes negative. Therefore, at time 3, the piezoelectric portion 40*a* is in the expanded state, and the piezoelectric portion 40*c* is in the contracted state. At this time, a position 3 of the tip P is at the position 0 in the Z direction while maintaining the position in the −X direction. Therefore, the tip P of the driving portion 38 is brought out of contact with the object to be driven 16.

Next, when the voltage applied as the second signal is also reduced to 0, the voltages V_R and V_L applied to the piezoelectric portions 40*a* and 40*c* become 0, and the tip P of the driving portion 38 returns to the origin position 0.

Through repetition of the above-mentioned operation, the object to be driven 16 can be moved in the −X direction. Movement in a +X direction can be performed by reversing the application of the voltages to the piezoelectric portion 40*a* and the piezoelectric portion 40*c*. Further, movement in the Y direction can be performed by controlling application of voltages to the piezoelectric portions 40*b* and 40*d*. Further, through control of movement in both of the X direction and the Y direction, movement in any direction in the XY plane can be controlled.

Figure 8A:
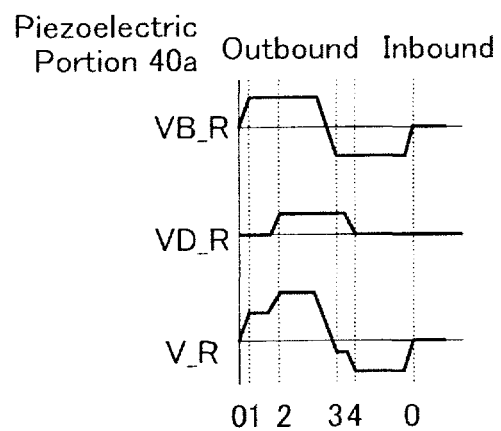
Figure 8B:
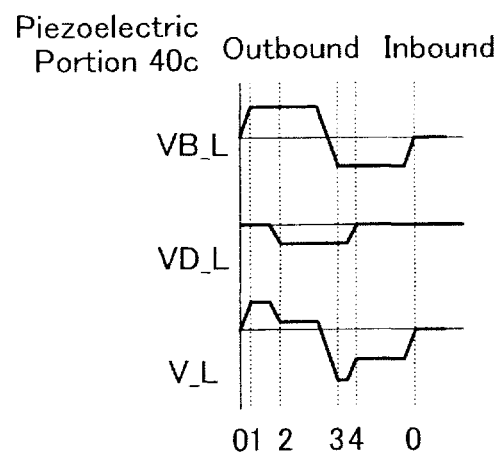
Figure 8B:
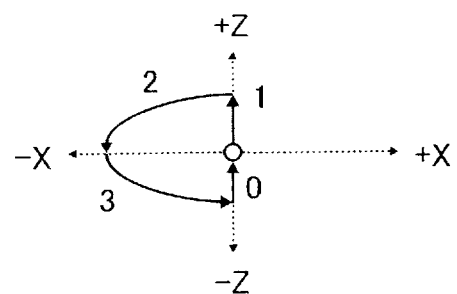

In FIG. 8A and FIG. 8B, a first modification example of the control by the control unit 58 is illustrated.

In the first modification example, it is preferred that the driving mechanism be of the bimorph type illustrated in FIG. 5. In the first modification example, the first signals VB_R and VB_L apply positive voltages in a forward path, and apply negative voltages in a return path, to thereby move the tip P of the driving portion 38 to a −Z direction to be retracted further as compared to the above-mentioned example.

Figure 9A:
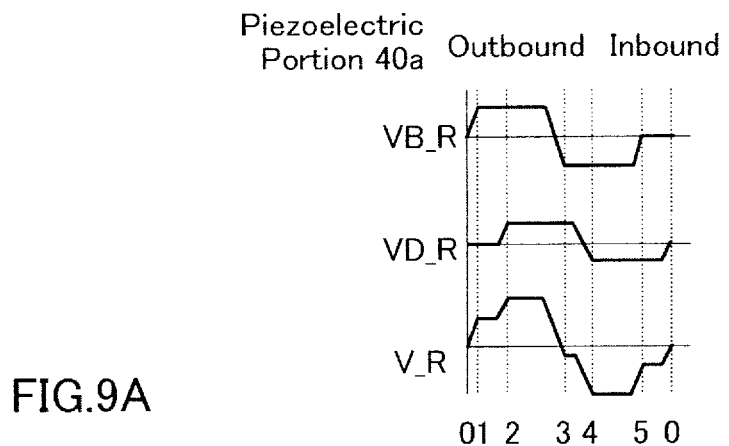
Figure 9B:
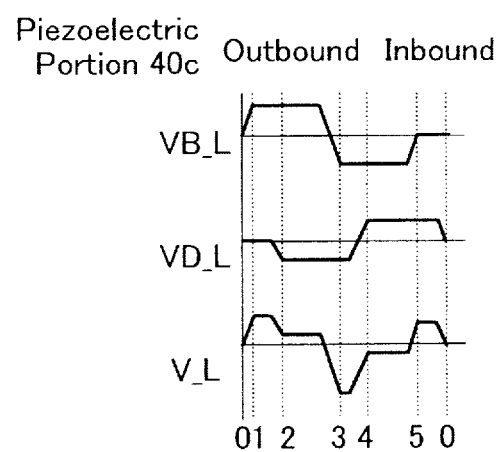
Figure 9B:
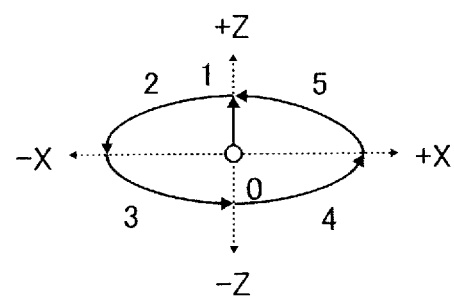

In FIG. 9A and FIG. 9B, a second modification example of the control by the control unit 58 is illustrated.

The second modification example is different from the first modification example in that the second signals VD_R and VD_L also apply positive and negative voltages in the forward path and the return path. The tip P of the driving portion 33 is moved to the −Z direction, and is then further moved in the +X direction, with the result that a movement distance in the X direction of the tip P of the driving portion 38 can be increased.

Figure 10:
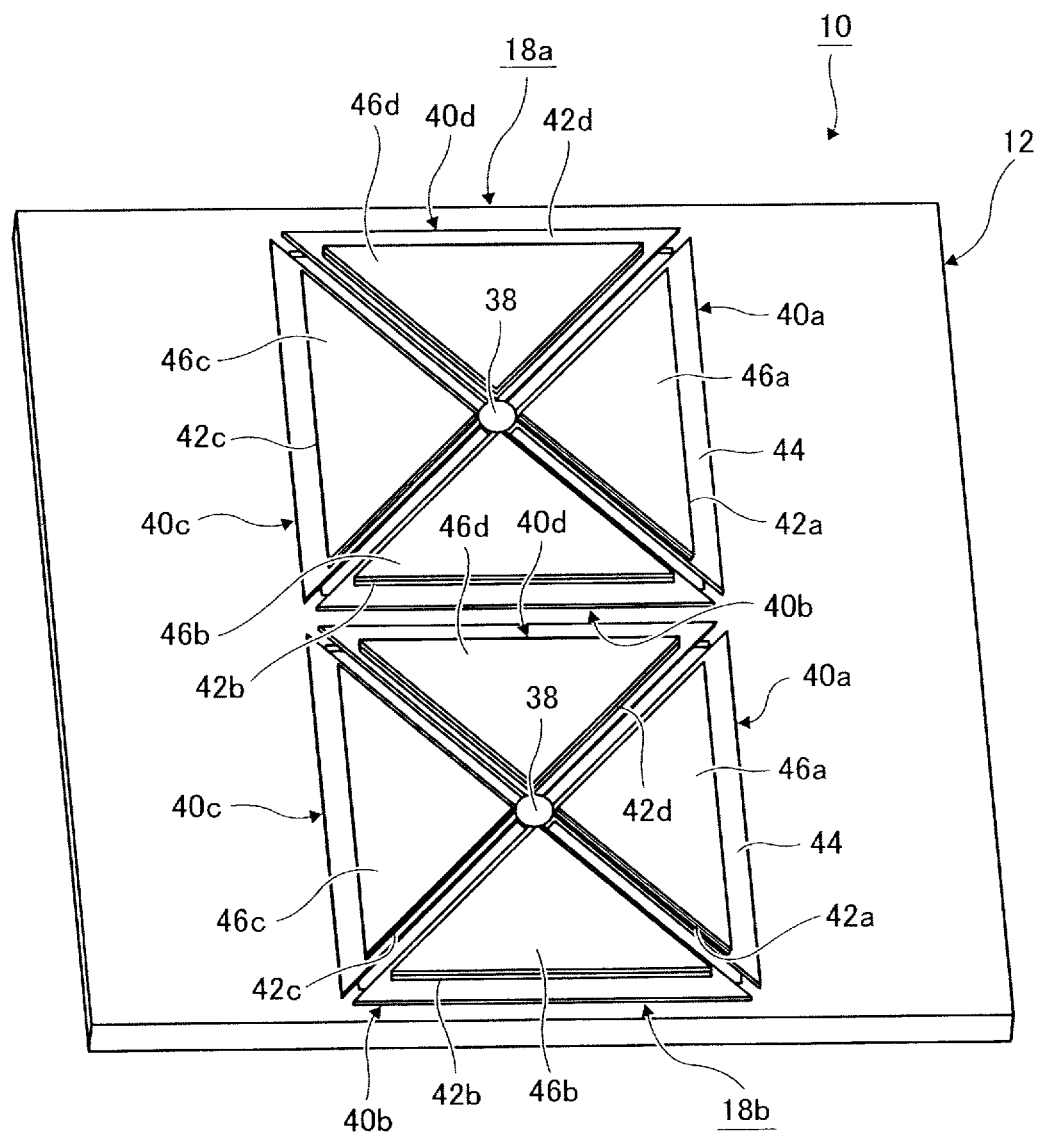
FIG. 10 is a perspective view for illustrating a driving device according to a second embodiment of the present invention.

In FIG. 10, a driving device 10 according to a second embodiment of the present invention is illustrated.

In the second embodiment, two driving mechanisms 18*a* and 18*b* are provided in parallel on the first surface 12*a* of the fixed body 12. The two driving mechanisms 18*a* and 18*b* have the same structure as that described above in the first embodiment. In other words, in each of the two driving mechanisms 18*a* and 18*b*, the piezoelectric portions 40*a* to 40*d* are arranged to be separated by 90° in a circumferential direction around the driving portion 38. In the second embodiment, the above-mentioned intermediate body 14 is not provided. Instead, the object to be driven is directly disposed on the two driving mechanisms 18*a* and 18*b*, and the driving portion 38 is brought into frictional contact with the object to be driven. Voltages are applied to the piezoelectric portions 40*a* and 40*c* in the X direction of the first driving mechanism 18*a* to bend the piezoelectric portions 40*a* and 40*c* in the X direction, for example, to thereby drive the object to be driven in the −X direction. Voltages are applied to the piezoelectric portions 40*a* and 40*c* in the X direction of the second driving mechanism 18*b* to bend the piezoelectric portions 40*a* and 40*c* in the X direction, to thereby drive the object to be driven in the +X direction. As a result, the driving portion 38 of the first driving mechanism 18*a* and the driving portion 38 of the second driving mechanism 18*b* move in directions that are different by 180°, with the result that the object to be driven can be rotated around the Z axis with the middle of the driving portions 38 and 38 being the center.

In this specification, the driving device used in a camera device has been described, but the present invention is equally applicable to another device.

What is claimed is:

1. A piezoelectric driving device, comprising:
   a driving portion to be brought into frictional contact with an object to be driven, which is moved with respect to a fixed body; and
   at least two piezoelectric portions, which are formed integrally with the driving portion, are arranged on a predetermined plane with the driving portion being sandwiched between the at least two piezoelectric portions, and are configured to be bent with respect to the predetermined plane when voltages are applied to the at least two piezoelectric portions,
   wherein outer edges of entirety of the at least two piezoelectric portions are fixed to the fixed body.

2. The piezoelectric driving device according to claim 1, wherein the at least two piezoelectric portions include four piezoelectric portions, which are arranged in a circulated manner around the driving portion on the predetermined plane.

3. The piezoelectric driving device according to claim 1, wherein the at least two piezoelectric portions include a plate-like piezoelectric element, a plate-like elastic body fixed to one surface of the plate-like piezoelectric element, and an electrode fixed to another surface of the plate-like piezoelectric element on an opposite side to the one surface.

4. The piezoelectric driving device according to claim 3, wherein the electrode is divided into at least two electrodes so as to correspond to the plate-like piezoelectric element.

5. The piezoelectric driving device according to claim 1, wherein the plate-like elastic body is divided into at least two plate-like elastic bodies so as to correspond to the plate-like piezoelectric element.

6. The piezoelectric driving device according to claim 3, wherein the driving portion is formed integrally with the plate-like elastic body.

7. The piezoelectric driving device according to claim 1, wherein the at least two piezoelectric portions further include a plate-like second piezoelectric element and a second electrode, one surface of the plate-like second piezoelectric element is configured to fix another surface of the plate-like elastic body on an opposite side to a surface of the plate-like elastic body that is fixed to the plate-like piezoelectric element, and the second electrode is fixed to another surface of the plate-like second piezoelectric element on an opposite side to the one surface of the plate-like second piezoelectric element.

8. The piezoelectric driving device according to claim 1, further comprising a control unit configured to control the voltages to be applied to the at least two piezoelectric portions, the control unit being configured to apply, to the at least two piezoelectric portions, a first signal for moving the driving portion along a normal direction of the predetermined plane, and a second signal for moving the driving portion along a direction in which the plate-like piezoelectric element is arranged.

9. An optical member driving device, comprising the piezoelectric driving device of claim 1,
   wherein the object to be driven includes one of an optical member and a member used to attach the optical member.

10. A camera device, comprising the optical member driving device of claim 9.

11. An electronic apparatus, comprising the camera device of claim 10.

* * * * *